(12) United States Patent
O

(10) Patent No.: US 7,609,555 B2
(45) Date of Patent: Oct. 27, 2009

(54) SENSING CIRCUIT FOR FLASH MEMORY DEVICE OPERATING AT LOW POWER SUPPLY VOLTAGE

(75) Inventor: Se-eun O, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 595 days.

(21) Appl. No.: 11/149,834

(22) Filed: Jun. 10, 2005

(65) Prior Publication Data
US 2005/0286305 A1    Dec. 29, 2005

(30) Foreign Application Priority Data
Jun. 29, 2004    (KR) ...................... 10-2004-0049743

(51) Int. Cl.
G11C 16/06    (2006.01)
G01R 19/00    (2006.01)
G11C 7/00     (2006.01)
H03F 3/45     (2006.01)

(52) U.S. Cl. ........................... 365/185.2; 327/51; 347/5
(58) Field of Classification Search ............. 365/185.2, 365/185.21, 207, 185.22; 327/51, 52, 53; 347/102, 5
See application file for complete search history.

(56) References Cited

U.S. PATENT DOCUMENTS

| | | | |
|---|---|---|---|
| 5,012,448 A * | 4/1991 | Matsuoka et al. ........... | 365/208 |
| 5,063,540 A * | 11/1991 | Takahashi ................... | 365/175 |
| 5,206,552 A * | 4/1993 | Iwashita ...................... | 327/53 |
| 5,631,865 A * | 5/1997 | Iwase et al. ............. | 365/189.15 |
| 5,642,308 A * | 6/1997 | Yoshida ................. | 365/185.12 |
| 5,717,640 A * | 2/1998 | Hashimoto ............. | 365/189.07 |
| 5,781,489 A * | 7/1998 | Okamoto .................... | 365/208 |
| 6,034,888 A * | 3/2000 | Pasotti et al. ........... | 365/185.03 |
| 6,055,187 A * | 4/2000 | Dallabora et al. ....... | 365/185.21 |
| 6,233,189 B1 | 5/2001 | Tanzawa et al. ............. | 365/207 |
| 6,407,946 B2 * | 6/2002 | Maruyama et al. ....... | 365/185.2 |

(Continued)

FOREIGN PATENT DOCUMENTS

JP    2-301100    12/2000

(Continued)

*Primary Examiner*—Stephen D Meier
*Assistant Examiner*—Leonard S Liang
(74) *Attorney, Agent, or Firm*—Mills & Onello LLP

(57) ABSTRACT

A sensing circuit that operates even at a low power supply voltage and reduces stress on a memory cell in a flash memory device without lowering a reading speed at the low power supply voltage is provided. The sensing circuit includes a first load element, a first inverting circuit, a second load element, a second inverting circuit, and a sense amplifier. The first load element includes an end connected with a bit line of a main cell array within the flash memory device. The first inverting circuit includes an input terminal connected with the bit line of the main cell array and an output terminal connected with another end of the first load element. The second load element includes an end connected with a bit line of a reference cell array within the flash memory device. The second inverting circuit includes an input terminal connected with the bit line of the reference cell array and an output terminal connected with another end of the second load element. The sense amplifier compares a voltage of the bit line of the main cell array with a voltage of the bit line of the reference cell array and generates an output signal according to a result of the comparison.

6 Claims, 3 Drawing Sheets

U.S. PATENT DOCUMENTS

| | | | |
|---|---|---|---|
| 6,445,616 B2 * | 9/2002 | Kim | 365/185.2 |
| 6,490,199 B2 * | 12/2002 | Lee et al. | 365/185.21 |
| 6,667,908 B2 | 12/2003 | Conte et al. | 365/185.2 |
| 6,674,668 B2 | 1/2004 | Ikehashi et al. | 365/185.24 |
| 6,801,466 B2 * | 10/2004 | Giove et al. | 365/207 |
| 2001/0003507 A1 * | 6/2001 | Maruyama et al. | 365/185.2 |
| 2002/0110022 A1 * | 8/2002 | Miyagi | 365/185.21 |

FOREIGN PATENT DOCUMENTS

| | | |
|---|---|---|
| KR | 00-44914 | 7/2000 |
| KR | 2002-0096746 | 12/2002 |

\* cited by examiner

SENSING CIRCUIT FOR FLASH MEMORY DEVICE OPERATING AT LOW POWER SUPPLY VOLTAGE

BACKGROUND OF THE INVENTION

This application claims the priority of Korean Patent Application No. 2004-49743, filed on Jun. 29, 2004, in the Korean Intellectual Property Office, the contents of which are incorporated herein in their entirety by reference.

1. Field of the Invention

The present invention relates to a flash memory device, and more particularly, to a sensing circuit for a flash memory device.

2. Description of the Related Art

With the development of various application systems such as mobile systems, the demand for flash memory devices, i.e., non-volatile memory devices, has increased. Particularly, as the operating power supply voltage for the devices has decreased, the necessity of a flash memory device capable of operating in a low power supply voltage has increased.

Usually, for a reading operation in a non-volatile memory device such as a flash memory device, a predetermined voltage is applied to a bit line in a main cell array and to a bit line in a reference cell array, and currents flowing in the two bit lines are compared to sense data stored in a memory cell within the main cell array. A swing width between the two bit lines directly affects reading speed and stress on a memory cell.

To increase the reading speed and reduce the stress on a memory cell in a non-volatile memory device during the reading operation, it is important to clamp a voltage in two bit lines at a predetermined level to reduce the voltage swing on the two bit lines.

Examples of conventional bit line sensing circuits used for a non-volatile memory device are disclosed in U.S. Pat. No. 6,233,189. However, conventional sensing circuits usually operate at a power supply voltage of 1.6 V or higher. When the power supply voltage increases even a small amount from a target voltage, bit line voltage swing also increases. As a result, reading speed may decrease, and stress on a memory cell may increase.

SUMMARY OF THE INVENTION

The present invention provides a sensing circuit that operates even at a low power supply voltage and reduces stress on a memory cell in a flash memory device without lowering a reading speed at the low power supply voltage.

According to an aspect of the present invention, there is provided a sensing circuit for a flash memory device, including a first load element, a first inverting circuit, a second load element, a second inverting circuit, and a sense amplifier. The first load element includes an end connected with a bit line of a main cell array within the flash memory device. The first inverting circuit includes an input terminal connected with the bit line of the main cell array and an output terminal connected with another end of the first load element. The second load element includes an end connected with a bit line of a reference cell array within the flash memory device. The second inverting circuit includes an input terminal connected with the bit line of the reference cell array and an output terminal connected with another end of the second load element. The sense amplifier compares a voltage of the bit line of the main cell array with a voltage of the bit line of the reference cell array and generates an output signal according to a result of the comparison.

The first load element may include a PMOS transistor including a source connected with the output terminal of the first inverting circuit and a drain and a gate which are connected in common with the bit line of the main cell array. Alternatively, the first load element may include an NMOS transistor including a drain and a gate which are connected in common with the output terminal of the first inverting circuit and a source connected with the bit line of the main cell array. As another alternative, the first load element may include an NMOS transistor including a drain connected with the output terminal of the first inverting circuit, a gate to which a predetermined voltage is supplied, and a source connected with the bit line of the main cell array.

The second load element may include a PMOS transistor including a source connected with the output terminal of the second inverting circuit and a drain and a gate which are connected in common with the bit line of the reference cell array. Alternatively, the second load element may include an NMOS transistor including a drain and a gate which are connected in common with the output terminal of the second inverting circuit and a source connected with the bit line of the reference cell array. As another alternative, the second load element may include an NMOS transistor including a drain connected with the output terminal of the second inverting circuit, a gate to which a predetermined voltage is supplied, and a source connected with the bit line of the reference cell array.

In one embodiment, the sense amplifier include an operational amplifier with one or more stages.

According to another aspect of the present invention, there is provided a sensing circuit for a flash memory device, including a sense amplifier, a first current mirror, a first inverting circuit, a second current mirror, a second inverting circuit, and a third current mirror. The sense amplifier senses a current flowing in an input terminal and generates an output signal according to a result of the sensing. The first current mirror is connected with a bit line of a main cell array within the flash memory device and with the input terminal of the sense amplifier and mirrors a current flowing in the bit line of the main cell array to the input terminal of the sense amplifier. The first inverting circuit includes an input terminal connected with the bit line of the main cell array and an output terminal connected with a power supply terminal of the first current mirror. The second current mirror is connected with a bit line of a reference cell array within the flash memory device and mirrors a current flowing in the bit line of the reference cell array. The second inverting circuit includes an input terminal connected with the bit line of the reference cell array and an output terminal connected with a power supply terminal of the second current mirror. The third current mirror mirrors the current mirrored by the second current mirror to the input terminal of the sense amplifier.

The first current mirror may include a first PMOS transistor including a source connected with the output terminal of the first inverting circuit and a drain and a gate which are connected in common with the bit line of the main cell array; and a second PMOS transistor including a source connected with the output terminal of the first inverting circuit, a gate connected with the gate of the first PMOS transistor, and a drain connected with the input terminal of the sense amplifier.

The second current mirror may include a first PMOS transistor including a source connected with the output terminal of the second inverting circuit and a drain and a gate which are connected in common with the bit line of the reference cell array; and a second PMOS transistor including a source connected with the output terminal of the second inverting circuit, a gate connected with the gate of the first PMOS transistor, and a drain connected with the third current mirror.

The third current mirror may include a first NMOS transistor including a drain and a gate which are connected in common with the second current mirror and a source connected with a reference voltage; and a second NMOS transistor including a drain connected with the input terminal of the sense amplifier, a gate connected with the gate of the first NMOS transistor, and a source connected with the reference voltage.

In one embodiment, the sense amplifier includes a single input amplifier with one or more stages.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described to be formed on another layer or on a substrate, the layer may be formed on the other layer or on the substrate, or a third layer may be interposed between the layer and the other layer or the substrate.

DETAILED DESCRIPTION OF THE INVENTION

Figure 1:
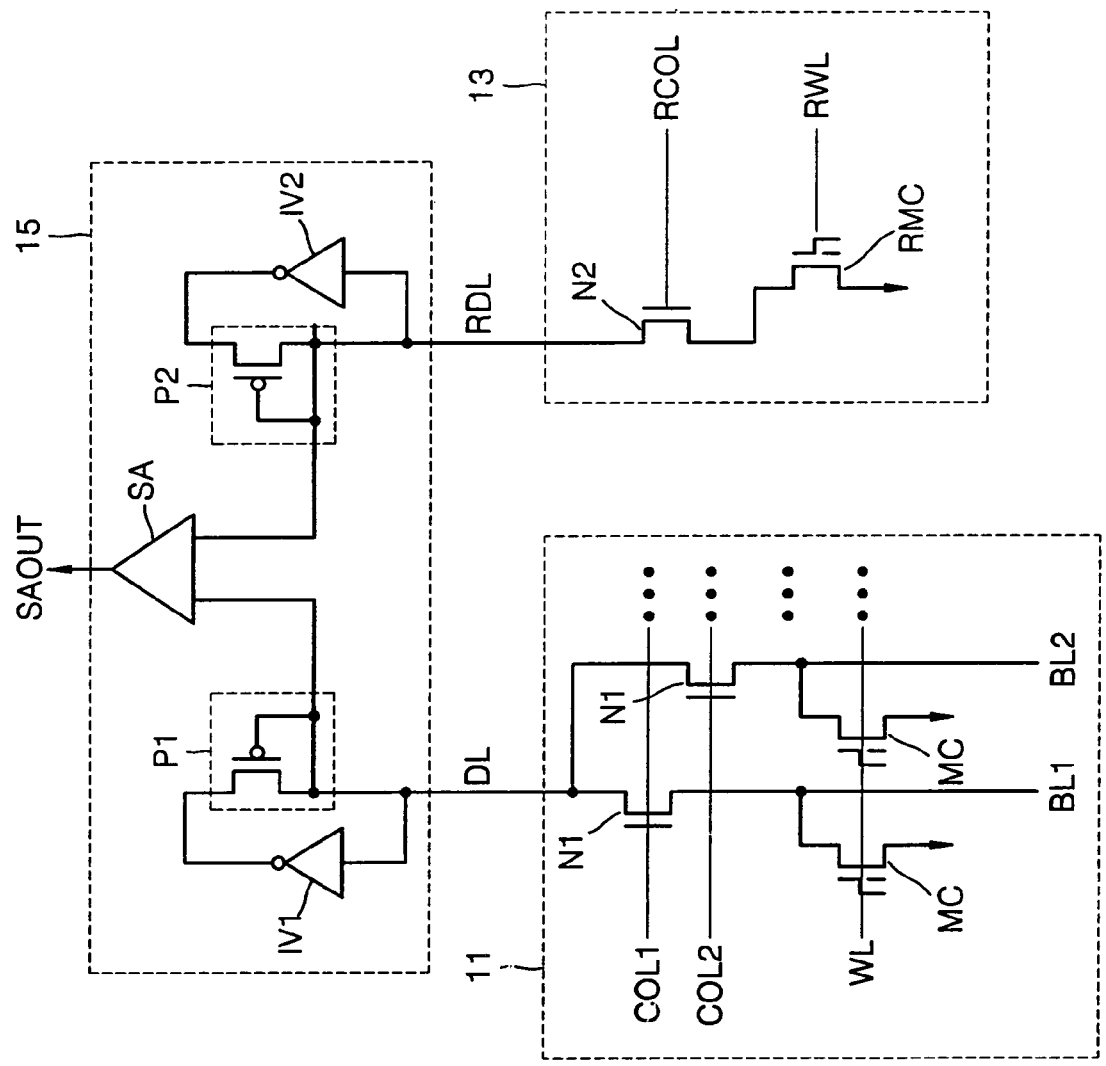
FIG. 1 is a diagram of a flash memory device including a sensing circuit according to an embodiment of the present invention.

FIG. 1 is a diagram of a flash memory device including a sensing circuit 15 according to an embodiment of the present invention. Referring to FIG. 1, the sensing circuit 15 according to the embodiment of the present invention is connected with a main cell array 11 and a reference cell array 13. The sensing circuit 15 compares a voltage level of a data line DL of the main cell array 11 with a voltage level of a data line RDL of the reference cell array 13, thereby sensing data stored in a predetermined memory cell MC within the main cell array 11.

The main cell array 11 includes a plurality of flash memory cells MC that respectively have gates connected with a word line WL and drains respectively connected with bit lines BL1 and BL2 and a plurality of selection transistors N1 that are connected between the data line DL and the bit lines BL1 and BL2, respectively, and are controlled by column selection signals COL1 and COL2, respectively.

The reference cell array 13 includes a reference memory cell RMC that has a gate connected with a reference word line RWL and a selection transistor N2 that is connected between the data line RDL and a drain of the reference memory cell RMC and is controlled by a reference column selection signal RCOL.

The sensing circuit 15 includes a first load element P1, a first inverting circuit IV1, a second load element P2, a second inverting circuit IV2, and a sense amplifier (SA).

One end of the first load element P1 is connected with a bit line, i.e., the data line DL, of the main cell array 11. An input terminal of the first inverting circuit IV1 is connected with the data line DL of the main cell array 11, and an output terminal thereof is connected with another end of the first load element P1.

One end of the second load element P2 is connected with a bit line, i.e., the data line RDL, of the reference cell array 13. An input terminal of the second inverting circuit IV2 is connected with the data line RDL of the reference cell array 13, and an output terminal thereof is connected with another end of the second load element P2.

The SA includes a first input terminal connected with the data line DL of the main cell array 11 and a second input terminal connected with the data line RDL of the reference cell array 13. The SA compares a voltage of the data line DL of the main cell array 11 with a voltage of the data line RDL of the reference cell array 13 and generates an output signal SAOUT according to the result of the comparison.

The first load element P1 is implemented by a PMOS transistor that has a source connected with the output terminal of the first inverting circuit IV1 and a drain and a gate connected in common with the data line DL of the main cell array 11. Alternatively, the first load element P1 may be implemented by an NMOS transistor that has a drain and a gate connected in common with the output terminal of the first inverting circuit IV1 and a source connected with the data line DL of the main cell array 11. As another alternative, the first load element P1 may be implemented by an NMOS transistor that has a drain connected with the output terminal of the first inverting circuit IV1, a gate to which a predetermined voltage is supplied, and a source connected with the data line DL of the main cell array 11.

Similarly, the second load element P2 is implemented by a PMOS transistor that has a source connected with the output terminal of the second inverting circuit IV2 and a drain and a gate connected in common with the data line RDL of the reference cell array 13. Alternatively, the second load element P2 may be implemented by an NMOS transistor that has a drain and a gate connected in common with the output terminal of the second inverting circuit IV2 and a source connected with the data line RDL of the reference cell array 13. As another alternative, the second load element P2 may be implemented by an NMOS transistor that has a drain connected with the output terminal of the second inverting circuit IV2, a gate to which a predetermined voltage is supplied, and a source connected with the data line RDL of the reference cell array 13.

Each of the first and second inverting circuits IV1 and IV2 is implemented by a single inverter or may be implemented by various types of logic circuits. The SA is a voltage sense amplifier and includes an operational amplifier with one or more stages.

The operation of the sensing circuit 15 according to the embodiment of the present invention will be described in detail below. Upon start of a reading operation, either of the column selection signals COL1 and COL2 is enabled, and either of the bit lines BL1 and BL2 is connected with the data line DL according to the enabled column selection signal COL1 or COL2. In addition, the word line WL is enabled. Accordingly, a voltage level of the data line DL is the same as that of the bit line BL1 or BL2 connected with the data line DL.

In this state, an output current of the first inverting circuit IV1 is applied to the data line DL via the first load element P1, thereby increasing the voltage level of the data line DL. When the voltage level of the data line DL exceeds a logic threshold of the first inverting circuit IV1, the output current of the first inverting circuit IV1 applied via the first load element P1 is decreased. As a result, the voltage level of the data line DL does not increase above a predetermined level.

The second inverting circuit IV2 and the second load element P2 operate in the same manner as the first inverting circuit IV1 and the first load element P1. Accordingly, a voltage level of the data line RDL of the reference cell array 13 does not increase above a predetermined level.

Such clamping of a voltage of the data line DL of the memory cell array 11 reduces a swing width in a voltage of the data line DL, i.e., a bit line. Similarly, clamping of a voltage of the data line RDL of the reference cell array 13 reduces a swing width in a voltage of the data line RDL.

Figure 2:
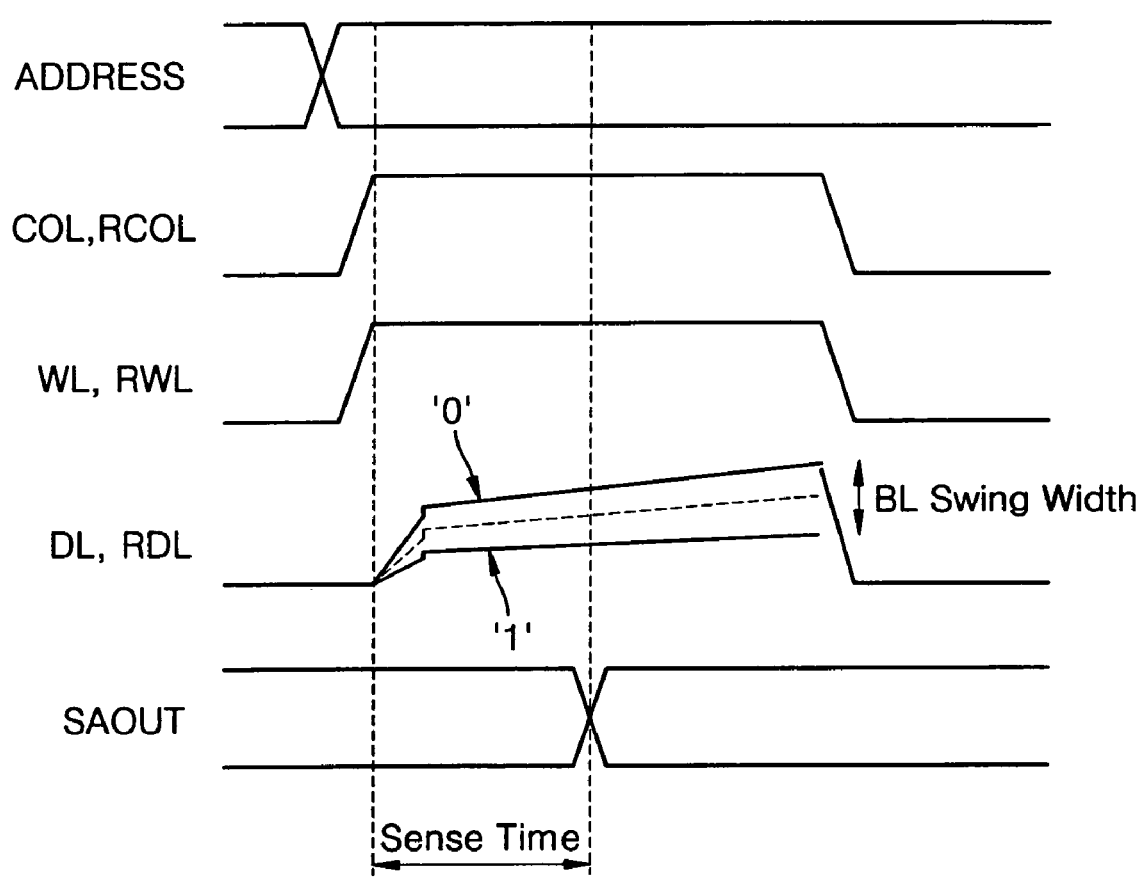
FIG. 2 is a timing chart of a reading operation in the flash memory device shown in FIG. 1.

As a result, the SA can quickly sense a current flowing in the memory cells MC even at a low power supply voltage. Consequently, a reading speed is increased, and stress on the memory cells MC is decreased. FIG. 2 is a timing chart of a reading operation in the flash memory device shown in FIG. 1.

Figure 3:
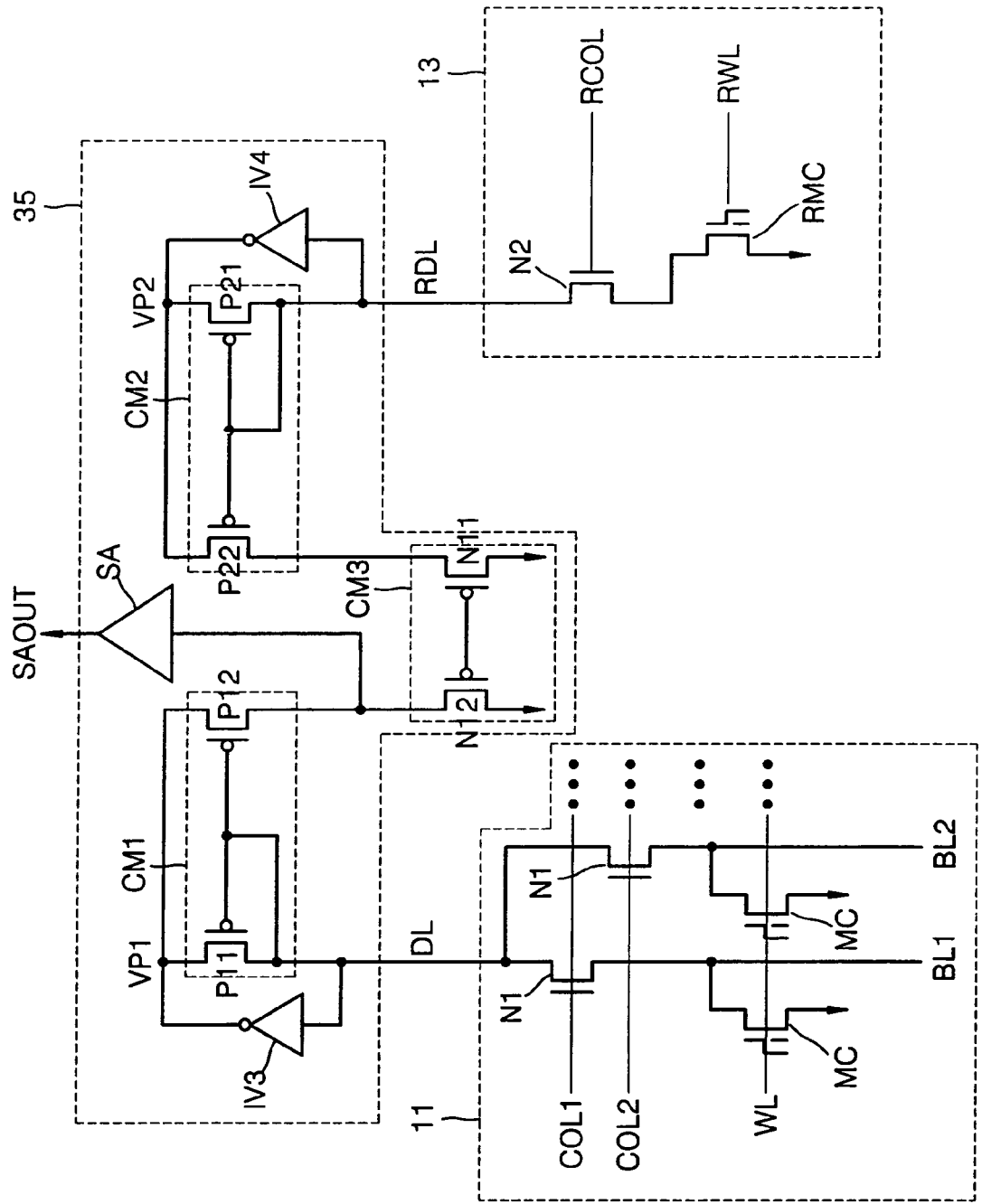
FIG. 3 is a diagram of a flash memory device including a sensing circuit according to another embodiment of the present invention.

FIG. 3 is a diagram of a flash memory device including a sensing circuit 35 according to another embodiment of the present invention. Referring to FIG. 3, the sensing circuit 35 is connected with the main cell array 11 and the reference cell array 13. The sensing circuit 35 compares a current flowing in the data line DL of the main cell array 11 with a current flowing in the data line RDL of the reference cell array 13, thereby sensing data stored in a predetermined memory cell MC within the main cell array 11. The main cell array 11 and the reference cell array 13 shown in FIG. 3 are the same as those shown in FIG. 1.

The sensing circuit 35 includes a SA, a first current mirror CM1, a second current mirror CM2, a third current mirror CM3, a first inverting circuit IV3, and a second inverting circuit IV4.

The SA senses a current flowing in its input terminal and generates an output signal SAOUT according to a result of the sensing. The first current mirror CM1 is connected with a bit line, i.e., the data line DL, of the main cell array 11 and the input terminal of the SA and mirrors a current flowing in the data line DL of the main cell array 11 to the input terminal of the SA. That is, a current identical to that flowing in the data line DL of the main cell array 11 flows in the input terminal of the SA due to the first current mirror CM1. An input terminal of the first inverting circuit IV3 is connected with the data line DL of the main cell array 11, and an output terminal thereof is connected with a power supply terminal VP1 of the first current mirror CM1.

The second current mirror CM2 is connected with a bit line, i.e., the data line RDL, of the reference cell array 13 and mirrors a current flowing in the data line RDL of the reference cell array 13. That is, a current identical to that flowing in the data line RDL of the reference cell array 13 is mirrored by the second current mirror CM2. An input terminal of the second inverting circuit IV4 is connected with the data line RDL of the reference cell array 13, and an output terminal thereof is connected with a power supply terminal VP2 of the second current mirror CM2.

The third current mirror CM3 mirrors the current mirrored by the second current mirror CM2, i.e., the current flowing in the data line RDL of the reference cell array 13, to the input terminal of the SA. Accordingly, the current flowing in the input terminal of the SA is the same as either of the current flowing in the data line DL of the main cell array 11 and the current flowing in the data line RDL of the reference cell array 13. The SA senses the current and generates the output voltage SAOUT according to a result of the sensing.

The first current mirror CM1 includes a PMOS transistor P11 that has a source connected with the output terminal of the first inverting circuit IV3 and a drain and a gate connected in common with the data line DL of the main cell array 11 and a PMOS transistor P12 that has a source connected with the output terminal of the first inverting circuit IV3, a gate connected with the gate of the PMOS transistor P11, and a drain connected with the input terminal of the SA. The PMOS transistor P11 corresponds to the first load element P1 in the embodiment illustrated in FIG. 1.

The second current mirror CM2 includes a PMOS transistor P21 that has a source connected with the output terminal of the second inverting circuit IV4 and a drain and a gate connected in common with the data line RDL of the reference cell array 13 and a PMOS transistor P22 that has a source connected with the output terminal of the second inverting circuit IV4, a gate connected with the gate of the PMOS transistor P21, and a drain connected with the third current mirror CM3. The PMOS transistor P21 corresponds to the second load element P2 in the embodiment illustrated in FIG. 1.

The third current mirror CM3 includes an NMOS transistor N11 that has a drain connected with the second current mirror CM2, a source connected with a reference voltage and a gate connected to the gate on the NMOS transistor N12. The NMOS transistor N12 has a drain connected with the input terminal of the SA, a gate connected with the gate of the NMOS transistor N11, and a source connected with the reference voltage.

The SA is a current sense amplifier and includes a single input amplifier with one or more stages.

The operation of the sensing circuit 35 according the embodiment illustrated in FIG. 3 is similar to that of the sensing circuit 15 according to the embodiment illustrated in FIG. 1. In detail, upon start of a reading operation, either of the column selection signals COL1 and COL2 is enabled, and either of the bit lines BL1 and BL2 is connected with the data line DL according to the enabled column selection signal COL1 or COL2. In addition, the word line WL is enabled. Accordingly, a voltage level of the data line DL is the same as that of the bit line BL1 or BL2 connected with the data line DL.

In this state, an output current of the first inverting circuit IV3 is applied to the data line DL via the PMOS transistor P11 within the first current mirror CM1, thereby increasing the voltage level of the data line DL. When the voltage level of the data line DL exceeds a logic threshold of the first inverting circuit IV3, the output current of the first inverting circuit IV3 applied via the PMOS transistor P11 is decreased. As a result, the voltage level of the data line DL does not increase above a predetermined level.

The second inverting circuit IV4 and the PMOS transistor P21 within the second current mirror CM2 operate in the same manner as the first inverting circuit IV3 and the PMOS transistor P11 within the first current mirror CM1. Accordingly, a voltage level of the data line RDL of the reference cell array 13 does not increase above a predetermined level.

Such clamping of a voltage of the data line DL of the memory cell array 11 reduces a swing width in a voltage of the data line DL, i.e., a bit line. Similarly, clamping of a voltage of the data line RDL of the reference cell array 13 reduces a swing width in a voltage of the data line RDL. As a result, the current flowing in the data line DL of the memory cell array 11 is clamped at a predetermined value, and the current flowing in the data line RDL of the reference cell array 13 is also clamped at a predetermined value.

As a result, the SA can quickly sense data stored in the memory cells MC even at a low power supply voltage. Consequently, a reading speed is increased, and stress on the memory cells MC is decreased.

As described above, a sensing circuit for a flash memory device according to the present invention operates even at a low power supply voltage and reduces stress on a memory cell in the flash memory device without lowering a reading speed at the low power supply voltage.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A sensing circuit for a flash memory device, the sensing circuit comprising:
   a first load element comprising an end connected with a bit line of a main cell array;
   a first inverting circuit comprising an input terminal connected with the bit line of the main cell array and an output terminal connected with another end of the first load element;
   a second load element comprising an end connected with a bit line of a reference cell array;
   a second inverting circuit comprising an input terminal connected with the bit line of the reference cell array and an output terminal connected with another end of the second load element; and
   a sense amplifier comparing a voltage of the bit line of the main cell array with a voltage of the bit line of the reference cell array and generating an output signal according to a result of the comparison,
   wherein the first load element comprises a PMOS transistor comprising a source connected with the output terminal of the first inverting circuit and a drain and a gate which are connected in common with the bit line of the main cell array.

2. A sensing circuit for a flash memory device, the sensing circuit comprising:
   a first load element comprising an end connected with a bit line of a main cell array;
   a first inverting circuit comprising an input terminal connected with the bit line of the main cell array and an output terminal connected with another end of the first load element;
   a second load element comprising an end connected with a bit line of a reference cell array;
   a second inverting circuit comprising an input terminal connected with the bit line of the reference cell array and an output terminal connected with another end of the second load element; and
   a sense amplifier comparing a voltage of the bit line of the main cell array with a voltage of the bit line of the reference cell array and generating an output signal according to a result of the comparison,
   wherein the first load element comprises an NMOS transistor comprising a drain and a gate which are connected in common with the output terminal of the first inverting circuit and a source connected with the bit line of the main cell array.

3. A sensing circuit for a flash memory device, the sensing circuit comprising:
   a first load element comprising an end connected with a bit line of a main cell array;
   a first inverting circuit comprising an input terminal connected with the bit line of the main cell array and an output terminal connected with another end of the first load element;
   a second load element comprising an end connected with a bit line of a reference cell array;
   a second inverting circuit comprising an input terminal connected with the bit line of the reference cell array and an output terminal connected with another end of the second load element; and
   a sense amplifier comparing a voltage of the bit line of the main cell array with a voltage of the bit line of the reference cell array and generating an output signal according to a result of the comparison,
   wherein the first load element comprises an NMOS transistor comprising a drain connected with the output terminal of the first inverting circuit, a gate to which a predetermined voltage is supplied, and a source connected with the bit line of the main cell array.

4. A sensing circuit for a flash memory device, the sensing circuit comprising:
   a first load element comprising an end connected with a bit line of a main cell array;
   a first inverting circuit comprising an input terminal connected with the bit line of the main cell array and an output terminal connected with another end of the first load element;
   a second load element comprising an end connected with a bit line of a reference cell array;
   a second inverting circuit comprising an input terminal connected with the bit line of the reference cell array and an output terminal connected with another end of the second load element; and
   a sense amplifier comparing a voltage of the bit line of the main cell array with a voltage of the bit line of the reference cell array and generating an output signal according to a result of the comparison,
   wherein the second load element comprises a PMOS transistor comprising a source connected with the output terminal of the second inverting circuit and a drain and a gate which are connected in common with the bit line of the reference cell array.

5. A sensing circuit for a flash memory device, the sensing circuit comprising:
   a first load element comprising an end connected with a bit line of a main cell array;
   a first inverting circuit comprising an input terminal connected with the bit line of the main cell array and an output terminal connected with another end of the first load element;
   a second load element comprising an end connected with a bit line of a reference cell array;
   a second inverting circuit comprising an input terminal connected with the bit line of the reference cell array and an output terminal connected with another end of the second load element; and
   a sense amplifier comparing a voltage of the bit line of the main cell array with a voltage of the bit line of the reference cell array and generating an output signal according to a result of the comparison,
   wherein the second load element comprises an NMOS transistor comprising a drain and a gate which are connected in common with the output terminal of the second inverting circuit and a source connected with the bit line of the reference cell array.

6. A sensing circuit for a flash memory device, the sensing circuit comprising:
   a first load element comprising an end connected with a bit line of a main cell array;

a first inverting circuit comprising an input terminal connected with the bit line of the main cell array and an output terminal connected with another end of the first load element;

a second load element comprising an end connected with a bit line of a reference cell array;

a second inverting circuit comprising an input terminal connected with the bit line of the reference cell array and an output terminal connected with another end of the second load element; and a sense amplifier comparing a voltage of the bit line of the main cell array with a voltage of the bit line of the reference cell array and generating an output signal according to a result of the comparison, wherein the second load element comprises an NMOS transistor comprising a drain connected with the output terminal of the second inverting circuit, a gate to which a predetermined voltage is supplied, and a source connected with the bit line of the reference cell array.

* * * * *

UNITED STATES PATENT AND TRADEMARK OFFICE
CERTIFICATE OF CORRECTION

PATENT NO. : 7,609,555 B2
APPLICATION NO. : 11/149834
DATED : October 27, 2009
INVENTOR(S) : Se-eun O It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1099 days.

Signed and Sealed this

Twelfth Day of October, 2010

David J. Kappos
*Director of the United States Patent and Trademark Office*